United States Patent
Tu et al.

(10) Patent No.: US 9,442,366 B2
(45) Date of Patent: Sep. 13, 2016

(54) LAYOUT PATTERN AND PHOTOMASK INCLUDING THE SAME

(71) Applicant: MACRONIX International Co., Ltd., Hsinchu (TW)

(72) Inventors: Chiung-Jung Tu, Hsinchu (TW); Chih-Hao Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 111 days.

(21) Appl. No.: 14/588,013

(22) Filed: Dec. 31, 2014

(65) Prior Publication Data

US 2016/0187768 A1 Jun. 30, 2016

(51) Int. Cl.
*G03F 1/38* (2012.01)
*G03F 1/36* (2012.01)

(52) U.S. Cl.
CPC .. *G03F 1/38* (2013.01); *G03F 1/36* (2013.01)

(58) Field of Classification Search
CPC .................................. G03F 1/36; G03F 1/38
USPC ........................................................ 430/5
See application file for complete search history.

(56) References Cited

U.S. PATENT DOCUMENTS

| 7,280,178 | B2 * | 10/2007 | Hashimoto | G02F 1/1345 349/152 |
| 7,879,677 | B2 | 2/2011 | Lee | |
| 8,958,211 | B2 * | 2/2015 | Hiroshima | H05K 1/18 174/534 |

FOREIGN PATENT DOCUMENTS

| CN | 102800628 | 11/2012 |
| JP | 2006013485 | 1/2006 |
| TW | 201344371 | 11/2013 |
| TW | 201407752 | 2/2014 |

OTHER PUBLICATIONS

"Office Action of Taiwan Counterpart Application", issued on Jun. 28, 2016, p. 1-p. 5, in which the listed references were cited.

* cited by examiner

*Primary Examiner* — Christopher Young
(74) *Attorney, Agent, or Firm* — J.C. Patents

(57) ABSTRACT

A layout pattern and a photomask including the layout pattern are provided. The layout pattern includes a plurality of main patterns and at least one auxiliary pattern. The main patterns are arranged in parallel to one another and extend in a first direction. The at least one auxiliary pattern is located between two outermost main patterns and connects the two outermost main patterns. The at least one auxiliary pattern is arranged in a second direction. The second direction is different from the first direction.

20 Claims, 2 Drawing Sheets

LAYOUT PATTERN AND PHOTOMASK INCLUDING THE SAME

BACKGROUND OF THE INVENTION

1. Field of the Invention

The invention relates to a layout pattern and a photomask including the layout pattern.

2. Description of Related Art

With the improvement in integrity of integrated circuits, the critical dimension (CD) of semiconductor devices continues to decrease. Consequently, the distance between the devices has to be shortened accordingly, which results in demand for higher resolution of the lithographic process. Generally, asymmetric pattern distribution is inevitable for small-sized high-integrity devices.

The asymmetric pattern comes from the layout pattern that has been designed in the photomask, for example. The layout pattern is transferred to a photoresist layer by the lithographic process and then transferred to a layer to be etched under the photoresist layer by an etching process. However, when transferring the asymmetric pattern to the photoresist layer, different pitches on two sides of the photoresist cause asymmetric surface tensions. For this reason, photoresist collapse may easily occur. Such a phenomenon causes defects in the devices and results in electrical problems and reduction of product yield. Hence, how to improve photoresist collapse caused by the asymmetric pattern is an important issue in this field.

SUMMARY OF THE INVENTION

The invention provides a layout pattern for improving photoresist collapse caused by an asymmetric pattern.

The invention provides a layout pattern that includes a plurality of main patterns and at least one auxiliary pattern. The main patterns are arranged in parallel to each other and extend in a first direction. The at least one auxiliary pattern is located between two outermost main patterns and connects the two outermost main patterns. The at least one auxiliary pattern is arranged in a second direction. The second direction is different from the first direction.

In an embodiment of the invention, the two outermost main patterns and the at least one auxiliary pattern form a ladder pattern.

In an embodiment of the invention, the layout pattern further includes a blank region located on the other side of the ladder pattern.

In an embodiment of the invention, a line width of at least one of the two outermost main patterns is greater than a line width of the other main patterns.

In an embodiment of the invention, a line width of at least one of the two outermost main patterns is greater than a line width of the other main patterns.

In an embodiment of the invention, the at least one auxiliary pattern is arranged in parallel to or not in parallel to each other.

In an embodiment of the invention, a line width of the at least one auxiliary pattern is 1 to 3 times the line width of the main patterns.

In an embodiment of the invention, wherein the line width of the at least one auxiliary pattern is equal to or unequal to each other.

In an embodiment of the invention, a pitch between the at least one auxiliary pattern is 1 to 3 times the line width of the main patterns.

In an embodiment of the invention, the pitch between the at least one auxiliary pattern is the same as or different from each other.

In an embodiment of the invention, a shape of the at least one auxiliary pattern comprises a strip shape, a block shape, an oblique line, or a combination thereof.

In an embodiment of the invention, the second direction is orthogonal to the first direction.

In an embodiment of the invention, the main patterns comprise a photoresist, a wire, a word line, a bit line, or a combination thereof.

The invention provides a photomask that includes a substrate and a layout pattern. The substrate includes a blank region and a pattern region. The layout pattern is disposed on the pattern region of the substrate and includes a plurality of main patterns and at least one auxiliary pattern. The main patterns are arranged in parallel to each other and extend in the first direction. The at least one auxiliary pattern is located between two outermost main patterns and connects the two outermost main patterns. The at least one auxiliary pattern is arranged in the second direction. The second direction is different from the first direction.

In an embodiment of the invention, the two outermost main patterns and the at least one auxiliary pattern form a ladder pattern.

In an embodiment of the invention, the ladder pattern is adjacent to the blank region of the substrate.

In an embodiment of the invention, a line width of the at least one auxiliary pattern is 1 to 3 times a line width of the main patterns.

In an embodiment of the invention, a pitch between the at least one auxiliary pattern is 1 to 3 times the line width of the main patterns.

In an embodiment of the invention, a line width of at least one of the two outermost main patterns is greater than the line width of the other main patterns.

Based on the above, the layout pattern provided by the invention includes the auxiliary pattern disposed between the two outermost main patterns, and the auxiliary pattern is connected with the two outermost main patterns to form the ladder pattern. Accordingly, the stability of the main patterns is enhanced to improve the photoresist collapse caused by an asymmetric pattern and prevent device defects or electrical problems, thereby increasing the product yield.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
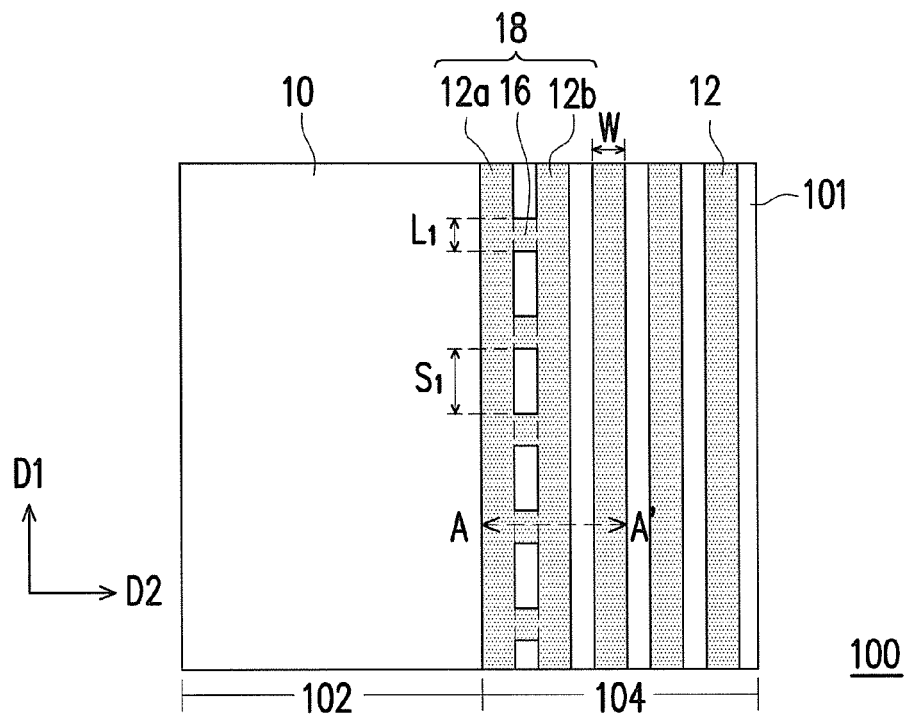
FIG. 1 is a schematic top view illustrating a layout pattern according to an embodiment of the invention.

FIG. 1 is a schematic top view illustrating a layout pattern according to an embodiment of the invention.

With reference to FIG. 1, a layout pattern 100 includes a plurality of main patterns 12 and at least one auxiliary pattern 16. The main patterns 12 are arranged in parallel to each other and extend in a first direction D1. A line width W of the main pattern 12 is in a range of 15 nm to 100 nm, for example. A shape of the main pattern 12 includes a strip shape. However, it should be noted that the invention is not limited thereto. The main pattern 12 is a strip-shaped pattern that has a high aspect ratio, for example. In an embodiment, the aspect ratio of the main pattern 12 is in a range of 1.5 to 5, for example. Moreover, the main patterns 12 may have the same or different line widths W and shapes. Those skilled in the art can respectively adjust the line width and shape of each main pattern 12 according to the requirements of design. The auxiliary pattern 16 is located between two outermost main patterns 12a and 12b and connects the two outermost main patterns 12a and 12b. An arrangement of the auxiliary patterns 16 between the two outermost main patterns 12a and 12b may be ordered or random. The auxiliary patterns 16 may be arranged in parallel to each other or not in parallel to each other. In an embodiment, the auxiliary patterns 16 extend in a second direction D2, for example. Alternatively, only a portion of the auxiliary patterns 16 extends in the second direction D2. The second direction D2 includes any direction that intersects the first direction D1. For example, the second direction D2 is orthogonal to the first direction D1. The auxiliary pattern 16 may have any shape that is capable of connecting the two outermost main patterns 12a and 12b. The auxiliary patterns 16 may have the same or different shapes. The shape of the auxiliary pattern 16 includes a strip shape, a block shape, an oblique line, or a combination thereof. In an embodiment, the auxiliary pattern 16 is a strip-shaped pattern, for example. Line widths L1 of the auxiliary patterns 16 may be equal to or unequal to each other. The line width L1 of the auxiliary pattern 16 is in a range of 15 nm to 300 nm, for example. In an embodiment, the line width L1 of the auxiliary pattern 16 is 1 to 3 times the line width W of the main pattern 12. The auxiliary patterns 16 have a pitch S1 therebetween, which may be the same as or different from each other. The pitch S1 is in a range of 15 nm to 300 nm, for example. The pitch S1 between the auxiliary patterns 16 may be greater than or smaller than the line width W of the main pattern 12. Alternatively, the pitch S1 may be equal to the line width W of the main pattern 12. In an embodiment, the pitch S1 between the auxiliary patterns 16 is 1 to 3 times the line width W of the main pattern 12. In addition, the line width L1 of the auxiliary pattern 16 and the pitch S1 may be the same as or different from each other. Those skilled in the art can adjust the line width L1 of each auxiliary pattern 16 and the pitch S1 according to the requirements of design.

With reference to FIG. 1 again, the two outermost main patterns 12a and 12b and the auxiliary pattern 16 form a ladder pattern 18, for example. The ladder pattern 18 is a repeated pattern composed of lines and spaces and extending in the first direction D1, for example. In an embodiment, the ladder pattern 18 is located between a blank region 10 and a plurality of main patterns 12 in the layout pattern 100, for example. However, the invention is not limited thereto. The ladder pattern 18 may be located between the main patterns 12 or at any position in the layout pattern 100.

Moreover, in the layout pattern 100, the line width of the two outermost main patterns 12a and 12b is the same as the line width W of the other main patterns 12, for example. However, the invention is not limited thereto. The line width of the main patterns 12a and 12b may be different from the line width W of the other main patterns 12. Details of another embodiment are explained below.

Figure 2:
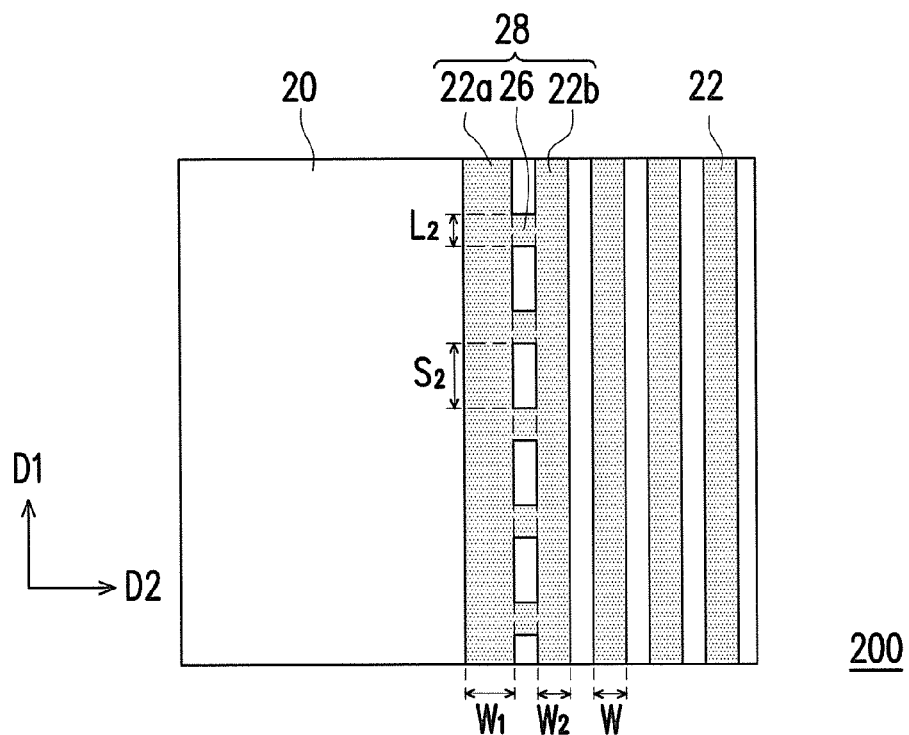
FIG. 2 is a schematic top view illustrating a layout pattern according to another embodiment of the invention.

FIG. 2 is a schematic top view illustrating a layout pattern according to another embodiment of the invention.

With reference to FIG. 2, a layout pattern 200 includes a plurality of main patterns 22 and an auxiliary pattern 26. The main patterns 22 are arranged in parallel to each other and extend in the first direction D1. The shape and the line width W of the main pattern 22 may be the same as those of the main pattern 12 in the layout pattern 100 as described above and thus are not repeated hereinafter. Two outermost main patterns 22 are main patterns 22a and 22b, for example. A line width W1 of the main pattern 22a is in a range of 15 nm to 300 nm, for example. A line width W2 of the main pattern 22b is in a range of 15 nm to 300 nm, for example. The line width W1 of the main pattern 22a and the line width W2 of the main pattern 22b may be smaller than or greater than the line width W of the main pattern 22 respectively. In an embodiment, the line width of at least one of the two outermost main patterns 22a and 22b is greater than the line width W of the other main patterns 22. The line widths W1 and W2 of the main patterns 22a and 22b are 1 to 3 times the line width W of the main pattern 22, for example. In addition to the above, the line width W1 of the main pattern 22a and the line width W2 of the main pattern 22b may be equal to or unequal to each other. In an embodiment, the line width W1 of the main pattern 22a is greater than the line width W2 of the main pattern 22b, for example. For example, the line width W1 of the main pattern 22a is 1.5 times the line width W2 of the main pattern 22b, for example. However, the invention is not limited thereto.

The auxiliary pattern 26 is located between the two outermost main patterns 22a and 22b and connects the two outermost main patterns 22a and 22b. The arrangement, shape, line width L2, and pitch S2 of the auxiliary patterns 26 may be the same as those of the auxiliary patterns 16 in the layout pattern 100 as described above and thus are not repeated hereinafter. In an embodiment, the line width L2 of the auxiliary pattern 26 is 1 to 3 times the line width W of the main pattern 22. In another embodiment, the line width L2 of the auxiliary pattern 26 is 1 to 3 times the line widths W1 and W2 of the main patterns 22a and 22b respectively, for example. Moreover, the pitch S2 of the auxiliary pattern 26 may be greater than, smaller than, or equal to the line width of the main pattern 22. In an embodiment, the pitch S2 between the auxiliary patterns 26 is 1 to 3 times the line width W of the main pattern 22.

With reference to FIG. 2 again, the two outermost main patterns 22a and 22b and the auxiliary patterns 26 form a ladder pattern 28, for example. The ladder pattern 28 is a repeated pattern composed of lines and spaces and extending in the first direction D1, for example. In an embodiment, the ladder pattern 28 is located between a blank region 20 and a plurality of main patterns 22 in the layout pattern 200, for example. However, the invention is not limited thereto. In another embodiment, the line width W1 of the main pattern 22a near the blank region 20 is greater than the line width W2 of the main pattern 22b away from the blank region 20, for example. It should be understood that the layout patterns 100 and 200 only serve as examples for illustration, and do not serve to limit the invention. In other words, any layout pattern including the ladder pattern 18 and/or 28 is included in the scope of the invention. Also, the layout patterns 100 and 200 of the invention may be used in a photomask or, alternatively, used to form a photoresist, a wire, a word line, a bit line, or other semiconductor devices including the ladder pattern. However, the invention is not limited thereto.

Those skilled in the art may transfer the layout pattern including the ladder pattern to any device as required based on the requirements of design.

In an embodiment of the invention, the layout patterns 100 and 200 may be used in a photomask. As shown in FIG. 1, the photomask, for example, includes a substrate 101 and the layout pattern 100. The substrate 101 is a transparent glass substrate, a transparent plastic substrate, or a substrate made of a proper translucent material, for example. The substrate 101 includes a blank region 102 and a pattern region 104. The blank region 102 is located at the periphery of the pattern region 104, for example. However, the invention is not limited thereto.

The layout pattern 100 is disposed on the pattern region 104 of the substrate 101. The layout pattern 100 is a translucent region or a partially translucent region of the substrate 101, for example. In an embodiment, the size of the layout pattern 100 in the photomask may be the same as the size of the original layout pattern 100. Alternatively, the size of the layout pattern 100 in the photomask may be several times (e.g., 1 to 5 times) the size of the original layout pattern 100.

Furthermore, the layout pattern 100 may be transferred to any material layer by using the photomask. The material layer may be a photoresist, a wire, a word line, a bit line, or any other material layers including the ladder pattern. Here, the main pattern 12 and the auxiliary pattern 16 may be a single-layer material layer, two-layer material layers, or multi-layer material layers.

In an embodiment, the layout patterns 100 and 200 may be transferred to a photoresist by using the photomask. It is worth noting that, by disposing and connecting the auxiliary pattern 16 between the two outermost main patterns 12a and 12b to form the ladder pattern 18, when the layout pattern 100 is transferred to the photoresist, the stability of the two outermost main patterns 12a and 12b is enhanced. Moreover, the ladder pattern 18 is located between the blank region 10 and the plurality of main patterns 12 to enhance the stability of the main patterns 12 and prevent the problem of photoresist collapse.

Besides, in the layout pattern 200, because the ladder pattern 28 is located between the blank region 20 and the plurality of main patterns 22, and the line width W1 of the main pattern 22a near the blank region 20 is greater than the line width W2 of the main pattern 22b away from the blank region 20, when the layout pattern 200 is transferred to the photoresist, the stability of the main patterns 22 is further enhanced to improve the problem of photoresist collapse caused by an asymmetry pattern.

In another embodiment, the layout patterns 100 and 200 may be transferred to a conductor layer, a dielectric layer, an insulating layer or a stack layer formed by a combination thereof by using the photoresist. For example, when the layout pattern 100 is transferred to the conductor layer, the main patterns 12 include a wire, serving as a word line or a bit line, for example, and the ladder pattern 18 includes a dummy wire, serving as a dummy word line or a dummy bit line, for example. However, the invention is not limited thereto. In other embodiments, the ladder pattern 18 may also serve as a word line or a bit line. Namely, the ladder pattern 18 may serve to selectively perform an electrical operation according to the requirements of device.

In yet another embodiment, by using the photoresist, the layout pattern 100 may be transferred to a stack layer. Details in this respect are described as follows.

Figure 3:
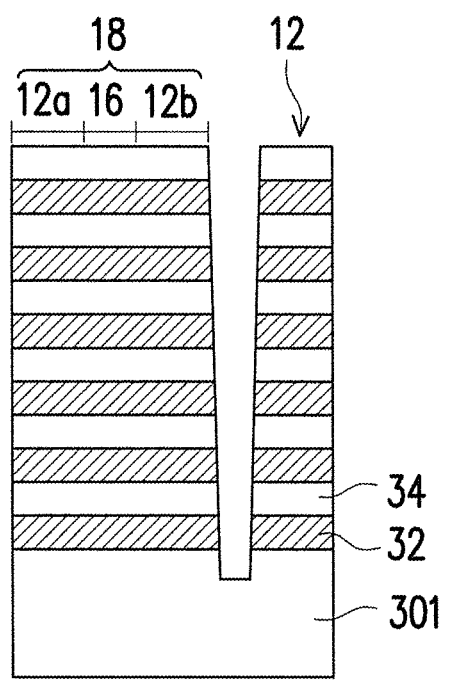
FIG. 3 is a schematic cross-sectional view illustrating a semiconductor device according to an embodiment of the invention.

FIG. 3 is a schematic cross-sectional view illustrating a semiconductor device 300 according to an embodiment of the invention. A top view of the semiconductor device 300 is shown as in FIG. 1, for example, and FIG. 3 is a cross-sectional view along a cross-section line A-A' in FIG. 1.

With reference to FIG. 3, in this embodiment, the main patterns 12 and the ladder pattern 18 may be a stack layer formed by alternately disposing at least two different material layers. For example, the main patterns 12 and the ladder pattern 18 may be a stack structure formed by alternately stacking polysilicon 32 and silicon oxide 34 on a substrate 301.

Provided below is a comparison between using a photomask with the conventional layout pattern and the photomask with the layout pattern of an example of the invention respectively for transferring patterns to photoresists by a lithographic process for observing photoresist collapse through a focus exposure matrix (FEM). In the experiment, two comparative examples were compared with an example of the invention, as illustrated in FIG. 1. The layout pattern of an example of the invention has the ladder pattern (e.g., the layout pattern 100 of FIG. 1). The experiment was carried out using the photomask including the layout pattern of the invention, for example. In the comparative example 1, the layout pattern only included main patterns 12 that had the same line width W, for example; and in the layout pattern of the comparative example 2, the line width of the outermost main pattern 12a was increased to 1.5 times the line width W of the other main patterns 12, for example.

The results of the experiment show that the depth of focus (DOF) of the photoresist, formed by the photomask with the layout pattern of the comparative example 1, on the focus exposure matrix was about 0.12 μm; the depth of focus (DOF) of the photoresist, formed by the photomask with the layout pattern of the comparative example 2, on the focus exposure matrix was about 0.14 μm; and the depth of focus (DOF) of the photoresist, formed by the photomask 310 of the invention, on the focus exposure matrix was greater than 0.16 μm. It is known from the above results that the depth of focus (DOF) of the photoresist, formed by the photomask with the layout pattern of the invention, is apparently greater than the depth of focus (DOF) of the photoresist formed by the conventional layout patterns. Therefore, the layout pattern having the ladder pattern of the invention improves the problem of photoresist collapse caused by an asymmetric pattern and enhances the process window.

To sum up, the layout pattern of the invention includes the auxiliary pattern that is disposed between the two outermost main patterns to form the ladder pattern, and the auxiliary pattern is connected with the main patterns. Accordingly, when transferring the layout pattern to the photoresist in the subsequent process, the stability of the two outermost main patterns is enhanced to prevent the photoresist from collapsing. Moreover, the ladder pattern is disposed between the blank region and a plurality of main patterns to further enhance the stability of the main patterns and improve the photoresist collapse caused by an asymmetric pattern, so as to prevent device defects or electrical problems and increase the product yield.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A layout pattern, comprising:
   a plurality of main patterns arranged in parallel to each other and extending in a first direction; and
   at least one auxiliary pattern disposed between two outermost main patterns and connecting the two outermost main patterns, wherein the at least one auxiliary pattern is arranged in a second direction, and the second direction is different from the first direction.

2. The layout pattern according to claim 1, wherein the two outermost main patterns and the at least one auxiliary pattern form a ladder pattern.

3. The layout pattern according to claim 2, wherein the ladder pattern is a dummy pattern.

4. The layout pattern according to claim 2, further comprising a blank region located on the other side of the ladder pattern.

5. The layout pattern according to claim 4, wherein a line width of the main pattern that is close to the blank region is greater than a line width of the main pattern that is away from the blank region.

6. The layout pattern according to claim 1, wherein a line width of at least one of the two outermost main patterns is greater than a line width of the other main patterns.

7. The layout pattern according to claim 1, wherein the at least one auxiliary pattern is arranged in parallel to or not in parallel to each other.

8. The layout pattern according to claim 1, wherein a line width of the at least one auxiliary pattern is 1 to 3 times the line width of the main patterns.

9. The layout pattern according to claim 1, wherein the line width of the at least one auxiliary pattern is equal to or unequal to each other.

10. The layout pattern according to claim 1, wherein a pitch between the at least one auxiliary pattern is 1 to 3 times the line width of the main patterns.

11. The layout pattern according to claim 1, wherein the pitch between the at least one auxiliary pattern is the same as or different from each other.

12. The layout pattern according to claim 1, wherein a shape of the at least one auxiliary pattern comprises a strip shape, a block shape, an oblique line, or a combination thereof.

13. The layout pattern according to claim 1, wherein the second direction is orthogonal to the first direction.

14. The layout pattern according to claim 1, wherein the main patterns comprise a photoresist, a wire, a word line, a bit line, or a combination thereof.

15. A photomask, comprising:
    a substrate comprising a blank region and a pattern region; and
    a layout pattern disposed on the pattern region of the substrate and comprising:
      a plurality of main patterns arranged in parallel to each other and extending in a first direction; and
      at least one auxiliary pattern disposed between two outermost main patterns and connecting the two outermost main patterns, wherein the at least one auxiliary pattern is arranged in a second direction, and the second direction is different from the first direction.

16. The photomask according to claim 15, wherein the two outermost main patterns and the at least one auxiliary pattern form a ladder pattern.

17. The photomask according to claim 16, wherein the ladder pattern is adjacent to the blank region of the substrate.

18. The photomask according to claim 15, wherein a line width of the at least one auxiliary pattern is 1 to 3 times a line width of the main patterns.

19. The photomask according to claim 15, wherein a pitch between the at least one auxiliary pattern is 1 to 3 times the line width of the main patterns.

20. The photomask according to claim 15, wherein a line width of at least one of the two outermost main patterns is greater than the line width of the other main patterns.

* * * * *